US009231138B2

(12) United States Patent
Kawamura

(10) Patent No.: US 9,231,138 B2
(45) Date of Patent: Jan. 5, 2016

(54) METHOD OF PRODUCING BARRIER FILM EXHIBITING EXCELLENT GAS BARRIER PROPERTY, AND BARRIER FILM

(75) Inventor: Tomonori Kawamura, Hino (JP)

(73) Assignee: KONICA MINOLTA, INC. (JP)

(*) Notice: Subject to any disclaimer, the term of this patent is extended or adjusted under 35 U.S.C. 154(b) by 549 days.

(21) Appl. No.: 13/392,581

(22) PCT Filed: Jul. 14, 2010

(86) PCT No.: PCT/JP2010/061878
§ 371 (c)(1),
(2), (4) Date: Feb. 27, 2012

(87) PCT Pub. No.: WO2011/027619
PCT Pub. Date: Mar. 10, 2011

(65) Prior Publication Data
US 2012/0153421 A1    Jun. 21, 2012

(30) Foreign Application Priority Data

Sep. 2, 2009  (JP) .................... 2009-202395

(51) Int. Cl.
H01L 51/44     (2006.01)
H01L 51/52     (2006.01)
H01L 31/0392   (2006.01)
H01L 51/00     (2006.01)

(52) U.S. Cl.
CPC ........ *H01L 31/0392* (2013.01); *H01L 51/0096* (2013.01); *H01L 51/44* (2013.01); *H01L 51/448* (2013.01); *H01L 51/5237* (2013.01); *Y02E 10/549* (2013.01)

(58) Field of Classification Search
CPC .......................... H01L 51/0097; H01L 51/448
See application file for complete search history.

(56) References Cited

U.S. PATENT DOCUMENTS

2009/0167164 A1* 7/2009 Fukuda et al. ............. 313/504
2009/0202743 A1* 8/2009 Schaepkens et al. ....... 427/576

FOREIGN PATENT DOCUMENTS

| JP | 8-281861 A | 10/1996 |
| JP | 2002-105676 A | 4/2002 |
| JP | 2002-222691 A | 8/2002 |
| JP | 2003-335880 A | 11/2003 |
| JP | 3511325 B2 | 1/2004 |
| JP | 2004-209973 A | 7/2004 |
| JP | 2005-111702 A | 4/2005 |
| JP | 2007-237588 A | 9/2007 |
| JP | 4040850 B2 | 11/2007 |
| JP | 2009-503157 A | 1/2009 |
| JP | 2009-255040 A | 11/2009 |
| WO | 2007/012392 A2 | 2/2007 |

OTHER PUBLICATIONS

International Search Report for International application No. PCT/JP2010/061878 mailing date of Aug. 10, 2010 with English Translation.
Written Opinion of the International Searching Authority for International Application No. PCT/JP2010/061878 with English translation.
Japanese Notice of Reasons for Rejection corresponding to Patent Application No. 2011-529848; Dispatch Date: Jul. 14, 2015, with English translation.

* cited by examiner

*Primary Examiner* — Thanh V Pham
(74) *Attorney, Agent, or Firm* — Cantor Colburn LLP

(57) ABSTRACT

Provided are a barrier film production method and a barrier film comprising at least one organic layer and two or more inorganic layers on a surface of a plastic film, wherein, under an atmosphere of at least 0.3 atmospheric pressure and at most 1.1 atmospheric pressure (1 atmospheric pressure is $1.01325 \times 10^5$ Pa), an organic layer coating liquid is applied on at least one surface of the plastic film, and dried to form the organic layer, thereafter, an inorganic layer coating liquid containing an inorganic compound is applied and dried on the organic layer to laminate at least 2 to 6 inorganic layers, and thereafter, at least two layers of the laminated inorganic layers are subjected to a conversion process.

13 Claims, No Drawings

METHOD OF PRODUCING BARRIER FILM EXHIBITING EXCELLENT GAS BARRIER PROPERTY, AND BARRIER FILM

CROSS REFERENCE TO RELATED APPLICATIONS

This is a U.S. national stage of application No. PCT/JP2010/061878, filed on 14 Jul. 2010. Priority under 35 U.S.C. §119(a) and 35 U.S.C. §365(b) is claimed from Japanese Application No. 2009-202395, filed 2 Sep. 2009, the disclosure of which are also incorporated herein by reference.

TECHNICAL FIELD

The present invention relates to a bather film mainly used for packaging electronic devices, or organic EL elements, solar cells or display materials such as a liquid crystal display, and relates to a production method thereof.

BACKGROUND ART

A barrier film in which a thin layer of a metal oxide such as aluminum oxide, magnesium oxide, or silicon oxide is formed on the surface of a plastic substrate or a film has been widely used for packaging a product which requires blocking of various types of gases such as water vapor and oxygen or for packaging to prevent the quality change of, for example, food, industrial products or medical products. Also, aside from the use for packaging, a barrier films has been used as a substrate for a liquid crystal display, solar cell, organic electroluminescence (EL) and the like.

An aluminum foil has been widely used as a packaging material in this field, however, disposal after use is becoming a problem, and, in addition, since an aluminum foil is basically an opaque material, it has a problem that it is difficult to check the content from outside. Further, it is absolutely difficult to be used for a display material which requires transparency.

Specifically, for a transparent substrate of which application to a liquid crystal display or a solar cell is in progress, added has been higher level of requirements, for example, capability of roll to roll production of the substrate, durability for a long period, freedom of the shape, and capability of curved display, in addition to the requirements of weight saving and getting larger. Replacement of a glass substrate which is heavy, fragile and difficult in increasing the size to a film substrate such as a transparent plastic is also in progress. For example, application of a polymer film as a substrate of an organic electroluminescent element has been disclosed. As aforementioned transparent plastic film, for example, polyethylene telephthalate (hereafter, abbreviated as "PET") of which oxygen permeation rate is relatively high has been used.

However, there has been a problem in that the gas barrier property of a film substrate such as a transparent plastic film is inferior to that of a glass substrate. For example, when such a substrate having an insufficient gas barrier property is used as a substrate of an organic photoelectric conversion element, water vapor or air may penetrates the substrate, resulting in the problem that the property tends to be degraded with time.

In order to overcome such a problem, a technique to provide a metal oxide thin layer on a film substrate to obtain a barrier film substrate has been known. As a barrier film used for a packaging material or for a liquid crystal display, a plastic film on which a silicon oxide or an aluminum oxide is vacuum evaporated has been known.

Instead of a vacuum evaporation method, a method to form a layer having a gas barrier property by applying a coating liquid containing polysilazane as a main component, followed by conducting a surface treatment has been known (refer t, for example, Patent Document 1). However, in none of these methods, the property as a gas barrier layer has been fully sufficient. Accordingly, a further improved gas barrier property, for example, a moisture permeating rate notably lower than $1\times10^{-2}$ g/m$^2$/day has been desired.

As a technique to further improve the gas barrier property, also known has been a method in which the aforementioned polysilazane layer and plasma chemical deposition method are used in combination (for example, refer to Patent Document 2). However, even in this method, aforementioned target of the gas bather property has not been attained.

A method to form a dense functional material exhibiting a peeling nature, an anti-scratching property, durability of luminance, permeability and a light blocking nature by using a plasma chemical deposition method employing a silazane compound as a raw material gas has been known. In the barrier film obtained by using this technique, there has been a possibility to generate particles of a size from submicron to micron, so called as "particles", in the plasma space between the electrodes. The particles are reaction products of a raw material and have been a specific problem of a plasma chemical deposition method. There also has been a possibility that the particles adhere to the surface of the deposited layer to disturb formation of a uniform layer, whereby it has been possible to deteriorate the quality of the barrier film due to the defect caused by the particles.

As a means to disperse the defect and satisfy the demand of a high barrier property against moisture, a technique to attain a moisture permeability of less than 0.1 g/m$^2$/day by using a laminate of an organic layer and an inorganic layer (for example, refer to Patent Document 3) has been disclosed. However, the organic-inorganic lamination type bather film disclosed in this document has had a problem that the bather nature is not fully enough.

Further, in this technique, it is necessary to form a layer under vacuum when the gas barrier layer is formed via a physical or a chemical deposition method, whereby it is necessary to reduce the atmospheric pressure in the film forming process, and to recover the normal atmospheric pressure after the barrier film formation, resulting in serious problems of increased equipment cost and production process.

Also, a technique to conduct a plasma chemical deposition method under an atmospheric pressure has been known. In this case, an adjusting process of the pressure can be avoided in the production process. However, in order to form a dense gas barrier film exhibiting a high barrier property, the accumulation rate is needed to suppress low. Accordingly, it has been difficult to attain an efficient productivity also in this case.

On the other hand, also known has been a gas barrier layer formation technique in which, after lamination of a partially alkali substituted polysilazane and a polysilazane, an oxidation treatment is conducted (for example, refer to Patent Document 4). However, only by the lamination of an alkyl substituted polysilazane layer and a polysilazane layer, the ability to relax the stress caused by bending the barrier film has not been enough, and the variation of barrier property due to heat or moisture, or after a long term storage has been large, whereby it has been difficult to maintain the barrier property in the early stage after the film production.

Instead of the aforementioned methods, the following technique has been known as a method to form a gas barrier film by conducting a surface treatment after a coating liquid containing polysilazane as a main component is applied (for example, refer to Patent Document 5). However, also in this technique, the function as a gas barrier layer of such as an organic EL element has been insufficient. Accordingly, further improvement in the gas barrier property, for example, a moisture permeability of notably lower than $1\times10^{-2}$ g/m$^2$/day, has been desired.

PRIOR ART TECHNICAL DOCUMENTS

Patent Documents

Patent Document 1: Japanese Patent Application Publication Open to Public Inspection (hereafter referred to as JP-A) No. 2007-237588
Patent Document 2: Japanese Patent No. 3511325
Patent Document 3: JP-A No. 2003-335880
Patent Document 4: Japanese Patent No. 4040850
Patent Document 5: JP-A No. 2009-255040

SUMMARY OF THE INVENTION

Problems to be Solved by the Invention

Accordingly, an object of the present invention is to provide a barrier film which can attain a notably high barrier property and a method of producing the same, and to provide a method of producing a bather film by which a high quality barrier film excellent in durability can be obtained with a simple production process in a short time without requiring too many production equipments.

Means to Solve the Problems

The above object of the present invention can be achieved by the following structures.
1. A method of producing a bather film comprising at least one organic layer and two or more inorganic layers on a surface of a plastic film comprising the steps of:
    forming an organic layer by applying an organic layer coating liquid on at least one surface of the plastic film, followed by drying, under a pressure of 0.3 atmosphere or more but 1.1 atmosphere or less (1 atmosphere being $1.01325\times10^5$ Pa);
    after the forming step, applying an inorganic layer coating liquid comprising an inorganic compound on the organic layer, followed by drying, to laminate 2-6 inorganic layers, under a pressure of 0.3 atmosphere or more but 1.1 atmosphere or less; and
    carrying out a conversion treatment on at least two layers among the laminated inorganic layers.
2. The method of Item 1, wherein forming the organic layer and laminating the inorganic layers are carried out under a pressure of 0.8 atmosphere-1.1 atmosphere.
3. The method of Item 1 or 2, wherein the inorganic layer coating liquid comprises a silazane compound.
4. The method of any one of Items 1-3, wherein the conversion treatment applied to the inorganic layers is a plasma treatment.
5. The method of any one of Items 1-3, wherein the conversion treatment applied to the inorganic layers is irradiation of vacuum ultraviolet light.
6. The method of any one of Items 1-5, wherein a sum of a number of the organic layer and a number of the inorganic layers is 3 or more but 7 or less.
7. A barrier film produced by the method of any one of Items 1-6.

Effect of the Invention

According to the present invention, a barrier film which can attain a notably high barrier property and a method of producing the same, and a method of producing a barrier film by which a high quality barrier film excellent in durability can be obtained with a simple production process in a short time without requiring too many production equipments could be provided. Further, the barrier film of the present invention exhibits an excellent gas bather property against moisture and oxygen gas, as well as excellent surface flatness, and a solar cell employing the same can attain both low cost and excellent durability.

PREFERRED EMBODIMENTS TO CARRY OUT THE INVENTION

Hereinafter, preferred embodiments to carry out the present invention will be described in detail, however, the present invention is not limited thereto.

The production method of the barrier film of the present invention will be explained.

[Plastic Films]

The plastic film is not specifically limited when formed with an organic material which can hold the inorganic layer having a later mentioned bather property.

Examples of a plastic film include plastic films of such as an acrylic ester, a methacrylic acid ester, polyethylene terephthalate (PET), polybutylene terephthalate, polyethylenenaphthalate (PEN), polycarbonate (PC), polyalylate, polyvinyl chloride (PVC), polyethylene (PE), polypropylene (PP), polystyrene (PS), nylon (Ny), aromatic polyamide, polyether ether ketone, polysulfone, polyethersulfone, polyimide, and polyetherimido, a heat-resistant transparent film containing silsesquioxane having an organic-inorganic hybrid structure as a basic skeleton (product name Sila-DEC™, produced by Chisso Corp.), and plastic films having two or more laminated layers of above mentioned plastics. With respect to the cost or the ease of acquisition, for example, polyethylene terephthalate (PET), polybutylene terephthalate and polyethylenenaphthalate (PEN), polycarbonate (PC) are preferably used. Alternatively, with respect to optical transparency, heat resistance and adherence with an inorganic layer, a heat resistant transparent film having a basic frame of silsesquioxane may be preferably used. The thickness of a substrate is preferably 5-500 μm and more preferably 25-250 μm.

Further, the plastic film substrate according the present invention is preferably transparent. It is because, when the substrate is transparent and the layer formed on the substrate is also transparent, a transparent barrier film can be obtained, whereby it is possible to use the barrier film as a transparent substrate of, for example, a solar cell and an organic EL device.

The substrate of a plastic film employing, for example, one of the above mentioned plastic films may be a stretched film or a non-stretched film.

A plastic film used in the present invention can be produced by a common method well-known in the art. For example, by melting a plastic used as a material in an extruding apparatus, and by extruding the melt through a tubular die or a T-die to quench the melt, a substantially amorphous, non-oriented and non-stretched substrate can be obtained. Also, a stretched substrate may be produced by stretching a non-stretched substrate in a film conveyance direction (a longitudinal direction) or a direction perpendicular to the film conveyance direction (a transverse direction) via uniaxial stretching, sequential biaxial stretching via a tenter method, simultaneous biaxial stretching via a tenter method or simultaneous biaxial stretching via a tubular method. The stretching ratio in this case is preferably 2-10 times in each of the longitudinal axis direction and the transverse axis direction, although the stretching ratio may be appropriately selected in accordance with the resin as a raw material of the substrate.

Further, for a plastic film according to the present invention, before providing an organic layer or an inorganic layer, a corona treatment may be conducted.

Furthermore, an anchor coat agent layer may be provided on the plastic film surface concerning the present invention for the purpose of improvement in adhesion with a vacuum evaporation film. Examples of an anchor coat agent used for the anchor coat agent layer include a polyester resin, an isocyanate resin, a urethane resin, an acrylic resin, an ethylene vinyl alcohol resin, a modified vinyl resin, an epoxy resin, a modified styrene resin, a modified silicone resin, and alkyltitanate, which may be used alone or in combination of two or more kinds thereof. A conventionally well-known additive agent can also be added to these anchor coat agents. The anchor coating may be conducted by applying an anchor coating agent such as described above on a plastic film via a method known in the art, for example, a roll coat method, a photogravure coat method, a knife coat method, a dip coat method, and a spray coat, followed by drying to remove such as a solvent or a dilution agent. The applying amount of the anchor coating agent as aforementioned is preferably around 0.1-5 $g/m^2$ (under a dried condition).

A bather film contains, on a plastic film such as a polyethylene terephthalate film, at least one inorganic layer, for example, formed by transforming a layer containing an inorganic material such as a silazane compound into a silicon oxide layer (hereafter, referred to as a gas barrier layer). Further, a barrier film contains a plastic film substrate, at least two inorganic layers and a later mentioned organic layer.

Regarding a barrier film of the present invention, a bather film containing an inorganic layer exhibiting a gas bather property can be obtained by: forming an organic layer by applying an organic layer coating liquid on at leas one surface of a plastic film under an environment of 0.3 atm or more but 1.1 atm or less, followed by drying; forming an inorganic layer by applying an inorganic layer coating liquid on the organic layer, followed by drying; and conducting a transformation treatment on the inorganic material in the inorganic layer.

Inorganic Layer (Gas Barrier Layer)

As a coating method of an inorganic layer, an appropriate method may be arbitrarily adopted. Specific examples of a coating method include a spin coat method, a roll coat method, a flow coat method, an inkjet method, a spray coat method, a printing method, a dip coat method, a casting film forming method, a bar coat method and a gravure printing method. The coating thickness may be appropriately set up according to the purpose. For example, the coating thickness may be set up so that the thickness after dried is preferably 1 nm-100 μm, more preferably 10 nm-10 μm and the most preferably 10 nm-1 μm.

Next, the applied film is dried. The drying temperature is preferably 60° C.-200° C. and more preferably 70° C.-170° C. The drying time is preferably 30 seconds-24 hours and more preferably 1 minute to about 2 hours. By drying in such a range of time, a bather film having a preferable characteristic can be obtained since a part of the later mentioned silazane compound which is an inorganic compound is reacted to fix the molecules. The drying process may be conducted at a constant temperature, by stepwise changing the temperature or by continuously changing the temperature (increasing temperature and/or decreasing temperature). While drying, the humidity is preferably controlled to stabilize the reaction. The humidity is normally, 30% RH-90% RH and more preferably 40% RH to 80% RH. The inorganic compound used in the inorganic layer according to the present invention preferably contains a silazane compound.

The silazane compound for forming an inorganic layer can form a more homogeneous and flat inorganic layer when applied on the surface of a bather film substrate than when provided as a gas such as in the case of a CVD method. It is well known that, in a case of a CVD method, unnecessary foreign substance called as particles is form in the gas phase at the same time with the process in which the raw material of which reactivity is increased is accumulated on the substrate surface. However, generation of such particles can be suppressed by avoiding a raw material to exist in a plasma reaction space.

Examples of a preferable inorganic material used in the present invention include perhydropolysilazane and silsesquioxane.

Of these, preferable is a silicon-containing compound which is solid at an ambient temperature and perhydropolysilazane is more preferably used. As specific examples, cited may be AQUAMICA®, NAX120-20, NN110, NN310, NP 140 and SP 140 produced by AN ELECTRONIC MATERIALS. In order to promote the conversion to a silicon oxide, a catalyst such as an amine or a metal can also be added. When these materials are applied, a solvent which tends not to incorporate water, such as xylene, dibutyl ether, SOLVESSO® and a terpene, is preferably used, in order avoid a reaction of the applying liquid with water.

An organic component which is contained in the above-mentioned inorganic layer application liquid, and remains in the inorganic layer after the layer is dried is preferably suppressed as little as possible, since such a component tends to affect the gas barrier property, color the layer or reduce the transparency after the layer is converted to an inorganic layer. The amount of such an organic compound is generally less than 0.5% and preferably less than 0.1% based on the total mass of the layer.

(Method of Forming Inorganic Layer)

With respect to the method of forming inorganic layers according to the present invention, after stacking 2-6 inorganic layers by applying an inorganic layer coating liquid containing an inorganic compound on an organic layer followed by drying, a conversion treatment is conducted on at least two of the stacked inorganic layers.

As a method to convert a silazane compound to a silicon oxide compound, for example, a plasma treatment, an ultraviolet treatment or a heat treatment may be cited.

With respect to the inorganic layer of the present invention, a plurality of the same layers may be laminated as far as the number of layers is two or more, whereby the gas barrier property is further improved by laminating a plurality of layers.

(Plasma Treatment)

In the plasma treatment which is preferably used for a conversion treatment in the method of producing according to the present invention, a plasma discharge treatment is carried out while a discharge gas which easily forms a plasma state is supplied.

An oxidation reaction can be promoted by supplying oxygen having an oxidizing nature as a reaction gas. As a discharge gas, nitrogen gas and/or an element of the 18th group in the periodic table, in more concretely, helium, neon, argon, krypton, xenon or radon is used. Of these, nitrogen, helium and argon are preferably used, and, specifically, nitrogen is most preferably used also in view of the low cost.

Concretely, as disclosed in WO 2007/026545 pamphlet, it is preferable that two or more electric fields having different frequencies are applied in the discharge space by applying an electric field obtained by superposing a first high frequency electric field and a second high frequency electric field.

The frequency of the second high frequency electric field $\omega 2$ is higher than the frequency of the first high frequency electric field $\omega 1$, the relationship among the strength of the first high frequency electric field V1, the strength of the second high frequency electric field V2 and the strength of the discharge initiating electric field IV meets $$V1 \geq IV > V2 \text{ or } V1 > IV \geq V2,$$

and the power density of the second high frequency electric field is 1 W/cm$^2$ or more.

By employing such an electric discharge condition, for example, even nitrogen gas having a high discharge initiating electric field can initiate discharge, a high density and stable plasma state can be maintained, and highly efficient thin film formation can be carried out.

When nitrogen is used as a discharge gas by the abovementioned measurement, the strength of an discharge initiating electric field IV (½Vp–p) is around 3.7 kV/mm. Nitrogen gas is excited to cause a plasma state by applying an electric field of which the strength of the first high frequency electric field meets V1≥3.7 kV/mm in the above-mentioned relationship.

Here, as the frequency of the first power source, 200 kHz or less is preferably used. Further, the wave shape of the electric field may be a continuous wave or a pulse wave. The lower limit is preferably 1 kHz or less.

On the other hand, as the frequency of the first power source, 800 kHz or more is preferably used. The higher the frequency of the second power source is, the higher the density of the plasma is, whereby a dense and high quality thin film can be obtained. The higher limit is preferably around 200 MHz.

Regarding application of high frequency electric fields from such two electric sources, the first high frequency electric field is necessary to start the electric discharge of a discharge gas which require a high strength of discharge initiating electric field, and a dense and high quality thin film can be obtained due to a high plasma density caused by the high frequency and the high power density of the second high frequency electric field.

(Ultraviolet Treatment)

Ultraviolet ray irradiation is cited as one of the preferable means of a conversion treatment used in the method of production according to the present invention. In order to dissociate the molecular bond of an inorganic compound with the energy of ultraviolet light and to re-combine to form an inorganic layer exhibiting a high barrier property, it is important that the light is absorbed by the compound and the energy of the light is higher than the molecular bond energy.

As such a means, a low-pressure mercury lamp or a xenon excimer lamp can be preferably used.

Although a low-pressure mercury lamp and a xenon excimer lamp are suitably used as a light source, since the 172 nm line of a xenon excimer lamp is strongly absorbed by oxygen, irradiation is preferably carried out while the irradiation distance between the inorganic layer surface and an excimer lamp is made 0.1 mm-10 mm and the oxygen concentration in air is controlled.

(Conversion Treatment of Coated Layer Containing Polysilazane Using Vacuum Ultraviolet Light (VUV))

A bather layer is obtained by applying a solution containing polysilazane on a substrate, followed by conducting a conversion treatment in which the coated layer containing polysilazane is irradiated with vacuum ultraviolet light (VUV).

As vacuum ultraviolet light, vacuum ultraviolet light (VUV) of 100 nm-200 nm is preferably used.

Regarding the irradiation of vacuum ultraviolet light, the irradiation intensity and/or the irradiation time is set within the range where the substrate is not damaged. When the case where a plastic film is used as a substrate is taken as an example, it is preferable to conduct the irradiation for 0.1 second-10 minutes, preferably for 0.5 second-3 minutes while the substrate-lamp distance is set so that the intensity of light on the substrate surface is 10 mW/cm$^2$-300 mW/cm$^2$.

A commercially available lamp (for example, produced by USHIO Inc.) may be used as a vacuum ultraviolet irradiation apparatus.

The vacuum ultraviolet light (VUV) irradiation can be suitably applied for both a batch treatment and a continuous treatment, and can be suitably selected according to the shape of the substrate to be coated.

For example, in the case of a batch treatment, a substrate (for example, a silicon wafer) which has a layer of polysilazane coat on the surface can be treated in a vacuum ultraviolet light calcination furnace equipped with a vacuum ultraviolet light source. A vacuum ultraviolet light calcination furnace itself is commonly known and, for example, one produced by USHIO Inc. may be used. When the substrate which has polysilazane coat on the surface is a long length film, conversion to a ceramics can be conducted by being continuously irradiated with vacuum ultraviolet light in a drying zone equipped with a vacuum ultraviolet light source as described above while the substrate is conveyed.

Vacuum ultraviolet light has an energy larger than the force of atomic bond of most of the materials. Accordingly, it can be preferably used since the atomic bond can be directly cut due to an action only by a photon, which is called as a "light quantum process".

By employing this action, a conversion treatment can be effectively carried out at a low temperature without conducting hydrolysis.

The rare gas excimer lamp using excimer luminescence as a source of vacuum ultraviolet light is preferably used.

A method of using dielectric barrier discharge for obtaining excimer luminescence is known.

The dielectric barrier discharge is a thin discharge similar to thunder and called as a micro discharge, which is generated in the gas space by applying a high frequency voltage of several tens kHz between both electrodes while providing a gas space via a dielectric (a transparent quartz in the case of an excimer lamp), and the micro discharge vanishes when the streamer of the micro discharge reaches at the tube wall (a dielectric) because charge is accumulated on the dielectric surface.

This micro discharge is the discharge which spreads over the whole of the tube wall, by which the generation and the disappearance of discharge are repeated. For this reason, flickering of light occurs, which can be observed even with the naked eyes.

Since a streamer having a very high temperature locally reaches the tube wall directly, there may be a possibility to accelerate the degradation of the tube wall. As a method of obtaining excimer luminescence efficiently, discharge by non-electrode electric field is also possible in addition to dielectric barrier discharge.

<<Irradiation Intensity of Vacuum Ultraviolet Light>>

When the irradiation intensity is high, the probability of collision between a photon and a chemical bond in polysilazane increases, whereby the duration of the conversion reaction can be shortened. Also, since the number of photons which penetrate into inside increases, the thickness of converted layer is increased and for the improvement of the layer quality (densifying the layer) becomes possible.

However, too long duration of irradiation may cause deterioration of flatness or damage to materials other than the barrier film. Although the advance degree of the reaction is generally evaluated in terms of integral light quantity which is expressed by the product of irradiation intensity and irradiation time, there may be a case in which the absolute value of irradiation intensity is important.

Therefore, in the present invention, it is preferable to conduct a conversion treatment in which the maximum irradiation intensity of 50 mW/cm$^2$-200 mW/cm$^2$ at least once in a VUV irradiation process, in view of suppressing the damage of lamp or the member of a lamp unit, and attaining both improvement of conversion efficiency and bather property.

(Irradiation Time of Vacuum Ultraviolet Light (VUV))

The irradiation time in which vacuum ultraviolet light (VUV) is applied may be arbitrarily selected. However, the irradiation time in the irradiation process is preferably 0.1 second-1 minute and more preferably 0.5 second-0.5 minute, in view of damage to the substrate, occurrence of film defect and productivity.

(Oxygen Concentration at Vacuum Ultraviolet Light (VUV) Irradiation)

The oxygen concentration at the time of vacuum ultraviolet light (VUV) irradiation is preferably 300 ppm-10000 ppm (0.1%) and more preferably 500 ppm-5000 ppm.

By controlling the oxygen concentration within the above range, degradation of the bather property can be avoided by preventing formation of an oxygen excess barrier film.

At the time of vacuum ultraviolet light (VUV) irradiation, a dried inert gas is preferably employed as a gas other than oxygen, and, specifically, dried nitrogen gas is preferably used in view of its low cost.

The control of oxygen concentration can be conducted by measuring the flow rates of oxygen gas and the inert gas introduced into an irradiation container, and by controlling the flow rates.

For a UV ozone method, a low-pressure mercury lamp is mainly used since the low-pressure mercury lamp has a wider effective irradiation distance of 0-20 mm while there is almost no ability difference between both methods.

In the method of producing a bather film of the present invention, each of the aforementioned plasma treatment and ultraviolet light treatment, and a heat treatment within the range in which the plastic film is not damaged may be used alone or in combination thereof to carry out the conversion treatment.

Example of a means to carry out heating include a direct heating method using a heat roller or a heating plate and an intermediate heating method using hot air or infrared light irradiation.

(Organic Layer)

The organic layer of the present invention is provided in order to flatten the crude surface of a plastic film having protrusions or to flatten the transparent inorganic layer having asperity or pinholes due to the protrusions existing on the transparent plastic substrate in addition to the purpose of relaxing the stress due to bend of the barrier film. It is a preferable embodiment to form such an organic layer, for example, by applying a composition containing a photosensitive resin followed by drying, and by hardening.

The basic frame of the component which constitutes an organic layer contains, for example, carbon, hydrogen, oxygen, nitrogen and sulfur, and when an inorganic element such as silicon, titanium, aluminum or zirconium is contained in the basic frame, it may be difficult to obtain aforementioned effect.

As a photosensitive resin used for an organic layer, cited may be, for example, a resin composition containing an acrylate compound having a radically reactive unsaturated compound, a resin composition containing a mercapto compound having an acrylate compound and a thiol group, and a resin composition in which dissolved is a multifunctional acrylate monomer such as an epoxy acrylate, an urethane acrylate, a polyester acrylate, a polyether acrylate, a polyethyleneglycol acrylate, or glycerol methacrylate. Further, it is also possible to use an arbitrary mixture of the above resin composites. The photosensitive resin is not specifically limited as far as it contains a reactive monomer having one or more photopolymerizable unsaturated bond in the molecule.

The photosensitive resin composition contains a photo polymerization initiator. As a photo polymerization initiator, cited may a combination of a photo reductive dye such as benzophenone, o-benzoyl methyl benzoate, 4,4-bis(dimethylamine)benzophenone, 4,4-bis(diethylamine)benzophenone, α-amino acetophenone, 4,4-dichlorobenzophenone, 4-benzoyl-4-methyldiphenyl ketone, dibenzyl ketone, fluorenone, 2,2-diethoxyacetophenone, 2,2-dimethoxy-2-phenylacetophenone, 2-hydroxy-2-methylpropiophenone, p-tert-butyldichloroacetophenone, thioxanthene, 2-methylthioxanthone, 2-chlorothioxanthone, 2-isopropylthioxanthone, diethylthioxanthone, benzyldimethylketal, benzylmethoxyethylacetal, benzoin methyl ether, benzoin butyl ether, anthraquinone, 2-tert-butylanthraquinone, 2-almylanthraquinone, β-chloroanthraquinone, anthrone, benzanthrone, dibenzosuberone, methyleneanthrone, 4-azidobenzylacetophenone, 2,6-bis(p-azidobenzylidene)cyclohexane, 2,6-bis(p-azidobenzylidene)-4-methylcyclohexanone, 2-phenyl-1,2-butanedione-2-(o-methoxycarbonyl)oxime, 1-phenyl-1,2-propanedione-2-(o-methoxycarbonyl)oxime, 1,3-diphenyl-propanetrione-2-(o-methoxycarbonyl)oxime, 1-phenyl-3-ethoxy-propanetrione-2-(o-methoxycarbonyl) oxime, michler ketone, 2-methyl[[4-(methylthio)phenyl]-2-monopholino-1 propane, 2-benzyl-2-dimethylamino-1-(4-monopholinephenyl-butanone-1, naphthalenesulfonylchloride, quinolinesulfonyl chloride, n-phenylthioacrydone, 4,4-azobis isobutyronitrile, diphenyl disulfide, benzthiazole disulfide, triphenylphosphine, camphorquinone, carbon tetrachloride, tribromophenylsulfone, benzoin peroxide, eosin and methylene blue, and a reducing agent such as ascorbic acid and triethanol amine. These polymerization initiator may used alone or in combination of two or more kinds.

The method of forming an organic layer is not specifically limited, however, preferably employed are wet methods, for example, a spin coating method, a spray coating method, a blade coating method, and a dip coating method.

In the organic layer forming process, an additive such as an antioxidant, an ultraviolet absorber or a plasticizer may be added in the aforementioned photosensitive resin, if needed. An appropriate resin or an additive may be added in any organic layer irrespective of the laminate position in order to improve the film funning property or to avoid occurrence of pin holes.

Examples of a solvent used when forming an organic layer using an application liquid in which a photosensitive resin is dissolved or dispersed in a solvent include: alcohols such as methanol, ethanol, n-propanol, iso-propanol, ethylene glycol and propylene glycol; terpenes such as α- and β-terpineol; ketones such as acetone, methylethyl ketone, cyclohexanone, N-methyl-2-pyrrolidone, diethyl ketone, 2-heptanone and 4-heptanone; aromatic hydrocarbons such as toluene, xylene, and tetramethyl benzene; glycol ethers such as cellosolve, methyl cellosolve, ethyl cellosolve, carbitol, methyl carbitol, ethyl carbitol, butyl carbitol, propyleneglycol monomethyl ether, propyleneglycol monomethyl ether, propyleneglycol monoethyl ether, dipropyleneglycol monomethyl ether, dipropyleneglycol monoethyl ether, triethyleneglycol monomethyl ether and triethyleneglycol monoethyl ether; esters such as ethyl acetate, butyl acetate, cellosolve acetate, ethylcellosolve acetate, butylcellosolve acetate, carbitol acetate, ethylcarbitol acetate, butylcarbitol acetate, propyleneglycol monomethylether acetate, propyleneglycol monoethylether acetate, 2-methoxyethyl acetate, cyclohexyl acetate, 2-ethoxyetyl acetate and 3-methoxybutyl acetate; diethyleneglycol dialkylether, dipropyleneglycol dialkylether, 3-ethoxyethyl propionate; methyl benzoate; N,N-dimethylacetoamide; and N,N-dimethylformamide.

The flatness of an organic layer is a value expressed by the surface roughness specified by JIS B 0601, and the maximum profile peak height Rt (p) is preferably 30 nm or less. When Rt(p) is larger than this range, it may become difficult to smooth the irregularity after applying an inorganic compound.

The surface roughness is calculated from a cross-sectional curve of the irregularity obtained by a continuous measurement using a detector having a stylus of the minimal tip radius in an atomic force microscope (AFM), which is a roughness relating the amplitude of minute irregularity obtained by multiple measurements within a range of several tens μm using a stylus of the minimal tip radius.

The thickness of the organic layer of the present invention is preferably 1-10 μm and more preferably 2-7 μm. When the thickness of the organic layer is 1 μm or more, it becomes easier to obtain sufficient flatness as a film having an organic layer, and, when the thickness of the organic layer is 10 μm or less, it becomes easier to adjust the balance of the optical characteristic of the film.

(Hardening of Organic Layer)

The light used to irradiate the organic layer for the purpose of hardening of the organic layer of the present invention is usually the ultraviolet rays obtained from a high-pressure mercury lamp or a low-pressure mercury lamp. The irradiation energy is preferably 0.5 J/cm$^2$ or more, and is more preferably 2 J/cm$^2$ or more. Since the polymerization of an acrylate or a methacrylate tends to be disturbed by oxygen in air, the oxygen concentration or the partial pressure of oxygen in the polymerization process is preferably low. When the oxygen concentration at the time of polymerization is reduced by a nitrogen substitution method, the oxygen concentration is preferably 2% or less, and is more preferably 0.5% or less. When the partial pressure of oxygen at the time of polymerization is reduced by an evacuation method, the total pressure is preferably 1000 Pa or less, and is more preferably 100 Pa or less. It is specifically preferable that the ultraviolet ray-polymerization is carried out by applying energy of 2 J/cm$^2$ or more under an evacuation condition of 100 Pa or less.

The thickness of the organic layer is not specifically limited, however, if the thickness is too small, it becomes difficult to acquire the uniformity of film thickness, and if it is too large, cracks may be forms due to an external force and the barrier property tends to be deteriorated. The thickness of the organic layer is preferably 10-2000 nm, and is more preferably 20-1000 nm.

As the layer constitution of the barrier film formed on a plastic film via the method of the present invention, the following constitutions may be cited, however, the present invention is not limited thereto. The sum of the numbers of organic layer and inorganic layer is 3 or more, but 10 or less in which at least 2 inorganic layers are included, and, more preferably, it is 3 ore more, but 7 or less. When the number of layers exceeds 10 in the method of producing a barrier film of the present invention, the time and steps required to produce the barrier film increases while no notable improvement in the barrier property is expected.

1 Inorganic layer/Organic layer/Inorganic layer
2 Organic layer/Inorganic layer/Inorganic layer
3 Organic layer/Inorganic layer/Inorganic layer/Inorganic layer
4 Organic layer/Inorganic layer/Organic layer/Inorganic layer/
5 Organic layer/Inorganic layer/Organic layer/Inorganic layer/Inorganic layer
6 Organic layer/Inorganic layer/Inorganic layer/Organic layer/Inorganic layer/
7 Organic layer/Inorganic layer/Inorganic layer/Organic layer/Inorganic layer/Inorganic layer
8 Inorganic layer/Organic layer/Inorganic layer/Organic layer/Inorganic layer/Organic layer/Inorganic layer/
9 Organic layer/Inorganic layer/Organic layer/Inorganic layer/Organic layer/Inorganic layer/Organic layer/Inorganic layer With respect to the flatness of a barrier film, the maximum profile peak height Rt (p) is preferably 20 nm or less. When Rt(p) is larger than this range, formation of a short circuit between the anode and the cathode of the device may occur from the irregular protrusions on the barrier film, when the barrier film is used as a plastic substrate of a solar cell or a liquid crystal device, whereby the property of the device is deteriorated, which affects the life of the device adversely.

Ordinarily, the surface flatness gradually improves by laminating applied and then dried layers. This effect can be acquired when 3 or more layers are laminated. However, adversely, when the number of layers is increased and exceeds 10, mixing of layers tends to occur and thickness unevenness becomes noticeable. Accordingly, the number of layers is preferably kept in this range.

Other Layers (Bleedout Preventing Layer)

A bleedout preventing layer is preferably provided on the surface of a substrate opposite to the surface on which the organic layer is provided, in order to avoid the contamination of the contact layer due to the migration of such as an unreacted oligomer from the inside of the substrate to the surface, when a film having an organic layer is heated.

As far as the bleedout preventing layer has this function, the bleedout preventing layer may have the same constitution as that of the organic layer.

As an unsaturated organic compound having a polymerizable unsaturated group, which may be incorporated in a bleedout prevention layer, a polyvalent unsaturated organic compound having two or more polymerizable unsaturated groups in the molecule or a monovalent unsaturated organic compound having one polymerizable unsaturated group in the molecule may be cited.

Examples of a polyvalent unsaturated organic compound include ethyleneglycol di(meth)acrylate, diethyleneglycol di(meth)acrylate, glycerol di(meth)acrylate, glycerol tri (meth)acrylate, 1,4-butanediol di(meth)acrylate, 1,6-hexanediol di(meth)acrylate, neopentylglycol di(meth)acrylate, trimethylolpropane tri(meth)acrylate, dicyclopentanyl di(meth)acrylate, pentaerythritol tri(meth)acrylate, pentaerythritol tetra(meth)acrylate, dipentaerythritol hexa(meth) acrylate, dipentaerythritol monohydroxypenta(meth)acrylate, ditrimethylolpropane tetra(meth)acrylate, diethyleneglycol di(meth)acrylate, polyethyleneglycol di(meth)acrylate, tripropyleneglycol di(meth)acrylate and polypropyleneglycol di(meth)acrylate.

Examples of a mono unsaturated organic compound include methyl(meth)acrylate, ethyl(meth)acrylate, propyl (meth)acrylate, butyl(meth)acrylate, 2-ethylhexyl(meth) acrylate, isodecyl(meth)acrylate, lauryl isodecyl(meth)acrylate, stearyl(meth)acrylate, allyl(meth)acrylate, cyclohexyl (meth)acrylate, methylcyclohexyl(meth)acrylate, isobornyl (meth)acrylate, 2-hydroxyethyl(meth)acrylate, 2-hydroxypropyl(meth)acrylate, glycerol(meth)acrylate, glycidyl(meth)acrylate, benzyl(meth)acrylate, 2-ethoxyethyl (meth)acrylate, 2-(2-ethoxyethoxy)ethyl(meth)acrylate, butoxyethyl(meth)acrylate, 2-methoxyethyl(meth)acrylate, methoxydiethyleneglycol(meth)acrylate, methoxydiethyleneglycol(meth)acrylate, methoxypolyethyleneglycol(meth) acrylate, 2-methoxypropyl(meth)acrylate, methoxydipropyleneglycol(meth)acrylate, methoxytripropyleneglycol(meth) acrylate, methoxypolypropyleneglycol(meth)acrylate, polyethyleneglycol(meth)acrylate and polypropyleneglycol (meth)acrylate.

As other additive agents, a matting agent may be incorporated. As a matting agent, inorganic particles having an average particle diameter of 0.1-5 μm are preferably used.

As such inorganic particles, one kind or two or more kinds in combination of silica, alumina, talc, clay, calcium carbonate, magnesium carbonate, barium sulfate, aluminum hydroxide, titanium dioxide or zirconium dioxide may be used.

The matting agent containing inorganic particles is desirably contained in a ratio of 2 mass parts or more, preferably 4 mass parts or more, and more preferably 6 mass parts or more, but 20 mass parts or less, preferably 18 mass parts or less, and more preferably 16 mass parts or less, in total solid content of 100 mass parts.

(Other Ingredients)
(Ionizing Radiation Curable Resin)

As an ionizing radiation curable resin, an ionizing radiation curable coating material containing one kind or two or more kinds of photopolymerizable prepolymers or monomers, which can be hardened by being irradiated with ionizing radiation (ultraviolet radiation or electron radiation) may be employed.

As a photopolymerizabl prepolymer, an acrylic prepolymer which has two or more acrylylic groups in the molecule, and can form a three dimensional network structure by cross-linking polymerization is specifically preferably used. As such an acrylic prepolymer, for example, an urethane acrylate, a polyester acrylate, an epoxy acrylate, or a melamine acrylate may be used. As a photopolymerizable monomer, the polyvalent unsaturated organic compounds described above are applicable.

(Photopolymerization Initiator)

Examples of a photopolymerization initiator include: acetophenone, benzophenone, Michler's ketone, benzoin, benzyl methyl ketal, benzoin benzoate, hydroxycyclohexyl phenyl ketone, 2-methyl-1-(4-(methylthio)phenyl)-2-(4-morpholynyl)-1-propane, α-acyloxime ester and thioxanthone.

The aforementioned bleedout preventing layer can be prepared by: preparing a coating liquid obtained by mixing a hardcoat agent, a matting agent, and other component, if necessary, and by appropriately using a diluting solvent, if necessary; and applying the coating liquid on the surface of a substrate film according to a method known in the art, followed by irradiating the substrate with ionization radiation. Examples of a method to irradiate the substrate with ionization radiation include: irradiating the substrate with ultraviolet light having a wavelength range of 100-400 nm, preferably 200-400 nm from a very-high-pressure mercury lamp, a high-pressure mercury lamp, a low-pressure mercury lamp, a carbon arc or a metal halide lamp; and irradiating the substrate with an electron beam having a wavelength of 100 nm or less from a scanning type or a curtain type electron beam accelerator.

In the present invention, the thickness of a bleedout preventing layer is 1-10 μm and preferably 2-7 μm. By making the thickness of the bleedout preventing layer 1 μm or more, it becomes easier to provide a sufficient heat resistance as a film, and by making the thickness of the bleedout preventing layer 10 μm or less, the balance of optical properties of a flat film becomes easier to control, as well as it becomes easier to prevent curl of the barrier film in the case when the organic layer is provided on one side surface of a transparent polymer film.

In the present invention, the barrier layer containing aforementioned inorganic compound is preferably transparent. By making the barrier layer transparent, it becomes also possible to make the bather film transparent, whereby the bather film becomes possible to be used for a transparent substrate of such as a solar cell. The light transmittance of a bather film is preferably 80% or more and more preferably 90% or more when the wavelength of the test light is 550 nm.

(Atmospheric Pressure at the Time of Producing Barrier Film)

The atmospheric pressure at the time of producing the barrier film in the present invention is 0.3 atmospheres or more but 1.1 atmospheres or less.

When the atmospheric pressure is lower than this range, the surface roughness after dried tends to become larger, since the drying speed of a solvent may become higher than necessary when an organic layer or an inorganic layer is formed by applying an organic layer coating liquid or an inorganic layer coating liquid, followed by drying. On the contrary, when the atmospheric pressure is lower than this range, the surface of the dried layer tends to become irregular, whereby the surface roughness after dried becomes larger, since the drying speed of a solvent may become lower than necessary and the drying process gradually proceed while causing a convection flow in the coated layer under drying in addition to the fact that a longer drying time is needed for drying, when an organic layer or an inorganic layer is formed by applying an organic layer coating liquid or an inorganic layer coating liquid, followed by drying.

In the present invention, the most preferable embodiments is production under an atmospheric pressure (namely, a normal pressure). The atmospheric pressure as mentioned herein means that the pressure circumstance at the time of producing a barrier film is not arbitrarily controlled. In the production process of a bather film, when control of the pressure is necessary, specifically when an environment of a lower (vacuum) side pressure is necessary, time to evacuate the air in the apparatus or in the working circumstance is needed, and the time becomes longer when the degree of vacuum becomes higher, whereby the productivity becomes notably lowered.

When whole the working circumstance is evacuated to vacuum, the workability for a worker, for example, checking the production process, becomes extremely low, whereby the productivity is further lowered or an action to check the quality of the product becomes difficult.

The barrier film obtained via the production method of the present invention can be used as various sealing materials or a sealing film, for example, a package for an electronic device, or a display material such as a plastic film for a solar cell or a liquid crystal display.

The barrier film of the present invention can be used, for example, for an organic photoelectric conversion element. Since the bather film of the present invention is transparent, when used for an organic photoelectric conversion element, this barrier film can be used as a substrate and the element can be constructed so that sun light is introduced from this side. Namely, a transparent conductive layer such as an ITO layer can be provided as a transparent electrode to construct a resin substrate for an organic photoelectric conversion element. An organic photoelectric conversion element can be sealed off by: forming a porous semiconductor layer on an ITO transparent conductive layer use as an anode provided on a substrate; providing a cathode constituted of a metal layer to form an organic photoelectric conversion element; and laminating another sealing material (which may be the same as the above bather film), followed by adhering the aforementioned barrier film substrate and the peripheral to seal off the element, whereby an adverse affect of the outside moisture or oxygen gas to the element can be prevented.

The resin substrate for an organic photoelectric conversion element is obtained by forming a transparent conductive film on the layer which has an inorganic compound of thus obtained barrier film. Formation of a transparent conductive film can be conducted by using, for example, a vacuum evaporation method or a sputtering method. It can also be formed via a coating method, for example, by employing a sol-gel method using, for example, alkoxides of indium and tin.

The thickness of a transparent conductive film is preferably 0.1 nm-1000 nm.

Subsequently, an organic photoelectric conversion element using these barrier films and a resin substrate for an organic photoelectric conversion element obtained by fondling a transparent conductive film on the bather film will be explained.

[Sealing Film and Production Method Thereof]

It is one of the aspects of the present invention that a barrier film having a layer containing the aforementioned inorganic compound as a substrate. The barrier film of the present invention can be used as a sealing film of an organic photoelectric conversion element relating the present invention.

On the layer which has an inorganic compound of the barrier film which has a layer containing the aforementioned inorganic compound, a transparent conductive layer is further formed as an anode, a layer constructing an organic photoelectric conversion element is formed on the anode, a layer to be a cathode is laminated, and another barrier film is laminated thereon as a sealing film, followed by adhering.

As the "another sealing material (a sealing film)", a bather film having a layer containing the inorganic compound having the aforementioned dense structure can be employed.

Also, a bather film known in the art, for example, used as a wrapping material, such as a plastic film vacuum evaporated thereon silicon oxide or aluminum oxide, and a barrier film having a constitution in which dense layers containing a silicon compound and shock relaxing polymer layers having flexibility are alternatively laminated, may be used as the sealing film. Specifically, a metal foil on which resin laminate (a polymer layer) is formed is preferably used as a sealing film for a purpose in which ejection of light is not expected (transparency is not required), although it cannot be used as a barrier film on the light ejecting side.

In the present invention, a metal foil means a foil or a film of a metal produced, for example, by rolling, and it is distinguished from a thin film of a metal formed via sputtering or vacuum evaporation, or from an electrically conductive film formed from a fluid electrode material such as an electrically conductive paste.

The metal element of a metal foil is not specifically limited, and cited may be a copper (Cu) foil, an aluminum (Al) foil, a gold (Au) foil, a brass foil, a nickel (Ni) foil, a titanium (Ti) foil, a copper alloy foil, a stainless steel foil, a tin (Sn) Foil and a high nickel-content-alloy foil. Among these various metal foils, an aluminum foil may be cited as a specifically preferable metal foil.

The thickness of a metal foil is preferably 6-50 µm. When the thickness is less than 6 µm, pin holes may occur in the metal foil depending on the used material, whereby necessary barrier property (for example, a moisture permeability or an oxygen permeability) may not be obtained. When the thickness exceeds 50 µm, a problem of a higher cost may occur, or the merit of using a film may be lost since the thickness of the photoelectric conversion element becomes large.

In a metal foil having a resin film (a polymer film) laminated thereon, the various materials desctived in "KINOUSEI HOUSOUZAIRYO NO SHINTENKAI" (published by Toray Research Center, Inc.) may be used for the resin film, examples of which include: a polyethylene resin, a polypropylene resin, a polyethylene terephthalate resin, a polyamide resin, an ethylene-vinyl alcohol copolymer resin, an ethylene-vinyl acetate copolymer resin, an acrylonitrile-butadiene copolymer resin, a cellophane resin, a vinylon resin and a vinylidene chloride resin. Resins such as a polypropylene resin and a nylon resin may be stretched, or, further, may be coated with a vinylidene chloride resin. With respect to a polyethylene resin, a low density resin or a high density resin can be used.

Although will be mentioned later, as a method to seal two films, for example, a resin layer which can be thermally fused using a commonly used impulse sealer is laminated, and sealed using an impulse sealer by fusing. In this case, the thickness of a barrier film is preferably 300 µm or less since the handling property of the films and the thermal fusing property, for example, using an impulse sealer becomes more difficult in a sealing process of barrier films.

[Seal of Organic Photoelectric Conversion Element]

In the present invention, an organic photoelectric conversion element can be sealed off by: forming each layer of an organic photoelectric conversion element on a resin substrate for an organic photoelectric conversion element obtained by forming a transparent conductive layer on a resin film (a bather film) having a layer containing the aforementioned inorganic compound according to the present invention; and covering the cathode surface with the aforementioned sealing film under a purged circumstance with an inert gas.

As an inert gas, a rare gas such as He or Ar is preferably used besides $N_2$. A rare gas obtained by mixing He and Ar is also preferably used. The ratio of a rare gas in the gas phase is preferably 90-99.9% by volume. The storage stability of the organic photoelectric conversion element is improved by sealing under a purged circumstance with an inert gas.

When an organic photoelectric conversion element is sealed using the aforementioned metal foil laminated with a resin film (a polymer layer), it is preferable that a layer containing an inorganic compound is formed on a metal foil, and the surface of the layer containing an inorganic compound is adhered onto the cathode, but not the surface of the resin film laminated on the metal foil. When the polymer layer side is adhered onto the cathode, it may occasionally happen that electrical conduction partially occurs.

As the method to adhere a sealing film onto the cathode of an organic photoelectric conversion element, cited may be a method to laminate a film which is commonly used and can be thermally fused using an impulse sealer, for example, an ethylene-vinyl acetate copolymer (EVA) film, a polypropylene (PP) film or a polyethylene (PE) film, followed by sealing using an impulse sealer by fusing.

As an adhesion method, a dry lamination method is excellent in view of workability. In this method, a curable adhesives layer of about 1.0-2.5 µm thick is generally used. However, since the adhesive may tunnel, bleed out or cause wrinkles by shrinking when the applied amount of the adhesive is too much, the applied amount of the adhesive is preferably adjusted within 3-5 µm as a dried film.

A hot melt lamination method is a method to melt a hot melt adhesive agent and apply onto a substrate to form an adhesive layer. In this method, the thickness of the adhesive layer can be selected in a wide range of 1-50 µm. As a base resin of a generally used hot melt adhesive agent, for example, EVA, WWA, polyethylene, and butyl rubber are usable. Also, for example, rosin, a xylene resin, a terpene resin or a stylene resin is used as an adhesiveness providing agent, and, for example, a wax is used as a plasticizer.

The extrusion lamination method represents a method to apply a resin melted at a high temperature onto a substrate using a die. In this method, it is possible to select the thickness of the resin layer within a wide range of 1-50 µm.

As a resin used for the extrusion lamination method, for example, LDPE, EVA and PP are generally usable.

Subsequently, each layer of organic photoelectric conversion element materials (a constitution layer) constituting an organic photoelectric conversion element will be explained.

(Constitution of Organic Photoelectric Conversion Element and Solar Cell)

Preferable embodiments of an organic photoelectric conversion element relating the present invention will be explained, however, the present invention is not limited thereto. The organic photoelectric conversion element is not specifically limited as far as it contains an anode, a cathode and at least one electric power generation layer (a mixed layer of a p-type semiconductor and an n-type semiconductor, also referred to as a bulk heterojunction layer or an i layer), and is an element which generates electricity when irradiated with light.

Preferable examples of the layer constitution of an organic photoelectric conversion element will be shown below.

(i) Anode/power generation layer/cathode
(ii) Anode/hole transport layer/power generation layer/cathode
(iii) Anode/hole transport layer/power generation layer/electron transport layer/cathode
(iv) Anode/hole transportation layer/p-type semiconductor layer/power generation layer/n-type semiconductor layer/electron transport layer/cathode
(v) Anode/hole transport layer/1st luminescence layer/electron transport layer/middle electrode/hole transportation layer/2nd luminescence layer/electron transport layer/cathode The power generation layer needs to contain a p-type semiconductor material which can convey an electron hole, and an n-type semiconductor material which can convey an electron. These materials may form a heterojunction with substantially two layers or may form a bulk heterojunction with one layer inside of which is of a mixed state, while the bulk heterojunction is preferred in view of a higher photoelectric conversion efficiency. The p-type semiconductor material and the n-type semiconductor material will be described later.

As the same as the case of an organic EL element, the efficiency of taking out holes and electrons from the anode•cathode, respectively, can be improved by sandwiching the power generation layer with a hole transport layer and an electron transport layer. Accordingly, the constitutions having those (namely, (ii) and (iii)) are more preferable. The power generation layer itself may also be of a constitution in which the power generation layer is sandwiched between a layer containing a p-type semiconductor material and a layer containing an n-type semiconductor material as shown in (iv) (also referred to as p-i-n constitution) in order to improve the rectification property of holes and electrons (namely, selectivity of carriers taken out). Further, in order to improve the utilization efficiency of the sunlight, it may be of a tandem constitution in which sun light of different wavelength can be absorbed by respective power generation layers.

(Method of Film Formation and Method of Surface Treatment)

(Various Methods of Film Formation)

As a method of forming a bulk heterojunction layer in which an electron acceptor and an electron donor are mixed and as a method of forming transport layers electrodes, for example, a vacuum evaporation method and a coating method (including a cast method and a spin coat method) may be cited. Of these, as a method of forming a bulk heterojunction layer, for example, a vacuum evaporation method and a coating method (including a cast method and a spin coat method) may be cited. Among these methods, a coating method is preferred in order to prepare an element exhibiting a high photoelectric conversion efficiency. The coating method is advantageous also in view of film production rate.

The coating method used in such a case is not limited, however, examples of such a method include an spin coat method, a casting method from a solution, a dip coat method, a blade coat method, a wire bar coat method, a gravure coat method and a spray coat method. Further, patterning can be conducted employing printing methods, such as an inkjet method, a screen printing method, a relief printing method, an intaglio printing method, an offset printing method and a flexo printing method.

After coating, a heating process is preferably carried out in order to remove residual solvent, water and gas, and to provoke improvement in mobility and change of absorbing wavelength. When annealing is carried out in the production process, microscopic coaguration or microscopic crystlization is partially accelerated, whereby an appropriate phase separation structure can be attained in the bulk heterojunction layer. As the result, the mobility of a carrier is increased, whereby a high conversion rate can be achieved.

The power generation layer (a bulk heterojunction layer) may be formed of a mono layer in which electron acceptors and electron donors are homogeneously mixed, however, it is also possible that the power generation layer is constituted of a plurality of layers in which the mixing ratio of the electron acceptors and the electron donors is varied. In this case, it is possible to form the power generation layer using a material which can be insolubilized after coating as aforementioned.
(Patterning)

The method to carry out patterning of the power generation layer, the hole transport layer and the electron transport layer is not specifically limited, and a method well known in the art may be appropriately employed.

If the material for coating such as a bulk heterojunction layer or a transport layer is a soluble material, coating via a whole layer coating method such as a die coat method or a dip coat method may be conducted, followed by wiping off unnecessary portion, or direct patterning may be conducted via, for example, an inkjet method or a screen printing method.

In the case of an insoluble material, for example, an electrode material, patterning may be conducted via a method well known in the art, for example, by conducting vacuum evaporation using a mask when the electrode is accumulated under vacuum, or by conduction an etching method of a lift off method. Further, patterning may be conducted by transferring a pattern formed on a different substrate.

EXAMPLES

The present invention will be specifically explained with referring to examples, below, however, the present invention is not limited thereto.

Example 1

Preparation of Barrier Film No. 1

(Substrate)
As the substrate of a barrier film, a polyester film having a thickness of 125 µm (TETRON 03, produced by Teijin DuPont Films Japan Limited), both surfaces of which were subjected to an adhesion-enhancing treatment was annealed at 150° C. for 30 minutes to be used.
(Preparation of Film Having Organic Layer and Bleedout Preventing Layer)

A substrate for a barrier film was obtained by forming a bleedout preventing layer on one surface of the polyester film and an organic layer on the other surface under an atmospheric pressure of 1.0 atmosphere (1 atmosphere being $1.01325 \times 10^5$ Pa).
(Preparation of Bleedout Preventing Layer)

On one side surface of the above substrate, a UV curable organic/inorganic hybrid hard coat material OPSTAR Z7535 produced by JSR Corp. was applied using a wire bar so that the thickness after dried was 4 µm, followed by conducting a hardening treatment under a hardening condition: 1.0 J/cm², in air, and using a high-pressure mercury lamp, and a drying condition: 80° C. for 3 minutes. Thus, a bleedout preventing layer was formed.
(Preparation of Organic Layer)

Subsequently, on the other side surface of the above substrate, a UV curable organic/inorganic hybrid hard coat material OPSTAR Z7501 produced by JSR Corp. was applied using a wire bar so that the thickness after dried was 0.8 µm, followed by drying under a condition: 85° C. for 2 minutes. Then, a hardening treatment was conducted in air using a high-pressure mercury lamp under a hardening condition: 1.0 J/cm². Thus, an organic layer was formed.

At this time, the maximum profile peak height Rt(p) was 17 nm.

The surface roughness was calculated from a cross-sectional curve of the irregularity obtained by a continuous measurement using a detector having a stylus of the minimal tip radius in an atomic force microscope (AFM), which was a roughness relating an average of the amplitude of minute irregularity obtained by multiple measurements within a range of 50 µm using a stylus of the minimal tip radius.
(Preparation of Barrier Film)
(Formation of Inorganic Layer)

Subsequently, on the organic layer of the aforementioned sample on which an organic layer and a bleedout preventing layer were provided, a layer containing an inorganic compound was formed under the condition described below.
(Application of Layer Containing Silazane Compound)

A 20% by mass dibutyl ether solution of perhydroxypolysilazane (PHPS) (AQUAMICA NN120-20, produced by AZ Electronic Materials, Ltd.) was applied using a wireless bar, followed by drying, so that the layer thickness after dried was 0.15 µm, to obtain an applied and dried sample.
(Plasma Treatment)

A plasma treatment was conducted on the obtained sample under the following condition to form a thin layer having a gas barrier property (inorganic layer, namely, a layer containing a silazane compound), where by Barrier film No. 1 was obtained. The substrate temperature was kept at 125° C. during the film formation.

The plasma treatment was carried out using a plasma discharge treatment apparatus. A plurality of rod-shaped electrodes each facing a roll electrode were installed parallel to the film conveyance direction, and a plasma treatment was carried out on the coated surface by supplying a raw material and electric power to each electrode portion, as will be described below.

Both of the opposed electrodes were coated with a dielectric material of a thickness of 1 mm by thermal spraying. The distance between the electrodes after coated with the dielectric material was set to 1 mm. The metal base material which was coated with the dielectric material was of a jacket type made of stainless steel having a cooling function with cooling water. The discharge was carried out while controlling the electrode temperature with cooling water. A high frequency power source from OYO ELECTRIC Co., Ltd. (80 kHz) and a high frequency power source from Pearl Kogyo Co., Ltd. (13.56 MHz) were used as the power sources.

Discharge gas: $N_2$ gas
Reactive gas: 7% of oxygen based on whole the gas
Power of low frequency side power source: 3 W/cm² of 80 kHz wave
Power of high frequency side power source: 9 W/cm² of 13.56 MHz wave The maximum profile peak height Rt(p) after the plasma treatment was 12 nm.

The surface roughness was calculated from a cross-sectional curve of the irregularity obtained by a continuous measurement using a detector having a stylus of the minimal tip radius in an atomic force microscope (AFM), which was a roughness relating an average of the amplitude of minute irregularity obtained by multiple measurements within a range of 50 µm using a stylus of the minimal tip radius.

On the surface of the obtained inorganic layer, the aforementioned organic layer and inorganic layer were repeatedly formed under the same condition, and, finally, a 4-layer constitution of organic layer/inorganic layer/organic layer/inorganic layer was formed on a polyester film substrate. The surface roughness of the inorganic layer which was the outermost layer was 10 nm.

<Preparation of Barrier Film Nos. 2-8>

Barrier film Nos. 2-8 were prepared in the same manner as the preparation of Barrier film No. 1 in Example 1, except that the atmospheric pressure in the steps from the organic layer and the bleedout prevention layer formation step to the step of plasma treatment onto surface of the silazane compound was changed as shown in Table 1.

<Preparation of Organic Photoelectric Conversion Element>

On each of Barrier film Nos. 1-8, a first electrode was formed by patterning an indium.tin oxide (ITO) transparent conductive film accumulated to a thickness of 150 nm (of which sheet resistance was $10\Omega/\square$) to a width of 2 mm via a commonly used photolithographic technique and a wet etching technique. The patterned first electrode was washed via sequential steps of ultrasonic washing using a surfactant and ultra pure water and ultrasonic washing using ultra pure water, followed by drying under a nitrogen flow, and, finally, cleaned via ultraviolet/ozone cleaning.

On the transparent substrate, Baytron P4083 (produced by Starck) was applied and then dried to obtain a layer thickness of 30 nm, subsequently, the layer was subjected to a heat treatment at 150° C. for 30 minutes to form a hole transport layer.

After that, each substrate was carried in into a nitrogen chamber and preparation was carried out under a nitrogen atmosphere.

First, the above-mentioned substrate was heat-treated for 10 minutes at 150° C. under a nitrogen atmosphere. Then, a liquid obtained by mixing, in chlorobenzene, 3.0% by mass of 1:0.8 mixture of P3HT (produced by Plectronics, Inc.: regio-regular-poly-3-hexylthiophene) and PCBM (produced by Frontier Carbon Corporation: 6,6-phenyl-$C_{61}$-butyric acid methyl ester) was prepared, and then applied onto the resulting substrate, while filtering with a filter, so that the thickness was 100 nm, followed by drying while leaving at an ambient temperature. Subsequently, a heat treatment at 150° C. for 15 minutes was conducted, whereby a photoelectric conversion layer was formed.

Next, the substrate on which the aforementioned series of function layers were formed was moved into the chamber of a vacuum evaporation apparatus, and, after the inside of the vacuum evaporation apparatus was evacuated to $1 \times 10^{-4}$ Pa or less, lithium fluoride was accumulated to a thickness of 0.6 nm at an evaporation rate of 0.01 mm/sec, and, subsequently, metallic Al was accumulated to a thickness of 100 nm at an evaporation rate of 0.2 mm/sec through shadow masks having a width of 2 mm (vacuum evaporation was conducted by orthogonally crossing the masks so that the photo receiving portion became 2×2 mm), whereby a second electrode was formed. Obtained organic photoelectric conversion element was transferred to a nitrogen chamber, and sealing was conducted according to the following sealing method. Thus, organic photoelectric conversion elements corresponding to Barrier film Nos. 1-8 each having a 2×2 mm photo receiving portion were prepared.

(Sealing of Organic Photoelectric Conversion Element)

Under a circumstance purged by a nitrogen gas (an inert gas), two sheets of each of Barrier film Nos. 1-8, which had not been subjected to a bending treatment, were applied with an epoxy-photocurable adhesive as a sealant on the surface on which an inorganic layer was formed. Each of the photoelectric conversion elements obtained according to the aforementioned method was sandwiched between the adhesive applied surfaces of the two corresponding barrier films of Barrier film Nos. 1-8, respectively, and tightly adhered, followed by being irradiated with UV light from the substrate of one side. Thus, Organic photoelectric conversion elements 1-8 were prepared.

(Evaluation)

<Evaluation of Moisture Permeation Rate>

Evaluation was carried out according to the following measuring method.

(Equipment)

Vacuum evaporation apparatus: Vacuum evaporation apparatus JEE-400 produced by JEOL Co., Ltd.

Constant temperature constant humidity oven: Humidic Chamber IG47M produced by Yamato Scientific, Co., Ltd.

Laser microscope: VK-8500 produced by KEYENCE Corp.

Atomic force microscope (AFM): DI3100 produced by Digital Instruments.

(Raw Material)

Metal corrosive by reacting with water: Calcium (granular)

Metal exhibiting no moisture permeation: Aluminum ($\phi$3-5 mm, granular)

<Preparation of Cell for Evaluation of Steam Barrier Property>

On the surface having an inorganic compound of each of Barrier film Nos. 1-8, which had been subjected to 100 times repeated bending treatment at an angle of 180° to form a curvature radius of 10 mm in advance, metallic calcium was vacuum evaporated using a vacuum evaporation apparatus (Vacuum evaporation apparatus JEE-400 produced by JEOL Co., Ltd.) on the barrier film sample before a transparent conductive film was formed, while masking other than the portions to be evaporated (9 portions of the size 12 mm×12 mm). After that, the mask was removed while the vacuum was maintained, and aluminum was evaporated from another metal evaporation source onto entire surface of one side. After the aluminum sealing, the vacuum state was released, and, promptly, the aluminum sealed surface was faced with a quartz glass plate having a thickness of 0.2 mm through a UV curable resin for sealing (produced by Nagase ChemteX Corporation) under a dried nitrogen atmosphere, followed by being irradiated with ultraviolet light. Eight kinds of evaluation cells were thus prepared.

The obtained 8 kind of samples were stored under a high temperature-high humidity condition of 60° C. and 90% RH, and the amount of moisture permeated into the cell was calculated from the amount of corrosion of metallic calcium according to the method described in JP-A No. 2005-283561.

In order to confirm that there is no moisture permeation from a surface other than the barrier film surface, a sample in which metallic calcium was vacuum evaporated on a 0.2 mm thick quartz glass plated instead of the barrier film was stored under the same high temperature—high humidity condition of 60° C. and 90% RH, as a comparative sample, to confirm that there was no corrosion of metallic calcium even after 1000 hours.

5: less than $1 \times 10^{-4}$ g/m²/day
4: $1 \times 10^{-4}$ g/m²/day or more but less than $1 \times 10^{-3}$ g/m²/day
3: $1 \times 10^{-3}$ g/m²/day or more but less than $1 \times 10^{-2}$ g/m²/day
2: $1 \times 10^{-2}$ g/m²/day or more but less than $1 \times 10^{-1}$ g/m²/day
1: $1 \times 10^{-1}$ g/m²/day or more <Evaluation of Durability of Organic Photoelectric Conversion Element>

<<Evaluation of Energy Conversion Efficiency>>

Each organic photoelectric conversion element corresponding to each of above prepared Bather film Nos. 1-8 was irradiated with light of 100 mW/cm² from a solar simulator (AM 1.5 G filter). By evaluating an I-V property while placing a mask having an effective area of 4.0 mm² on the photo receiving portion, a short circuit current density Jsc (mA/cm$^2$), an open circuit voltage Voc (V) and a fill factor FF (%) were determined to evaluate the energy conversion efficiency PCE (%) calculated according to following Formula 1 for each of the four photo receiving portions formed on the same element. Then, an average of the above four energy conversion efficiencies was obtained.

$$PCE(\%)=[Jsc(mA/cm^2) \times Voc(V) \times FF(\%)] \quad \text{Formula 1}$$

The energy conversion efficiency as an initial cell property was measured, and then the degree of time degradation of the property was evaluated from the residual ratio of the energy conversion efficiency after an enforced degradation test in which the element was stored at 60° C. under 90% RH for 1000 hours.

The ratio of energy conversion efficiency after enforced degradation test/initial energy conversion efficiency.
5: 90% or more
4: 70% or more, but less than 90%
3: 40% or more, but less than 70%
2: 20% or more, but less than 40%
1: less than 20%

[Comparison of Time Necessary to Prepare Barrier Film]

While setting the time needed to prepare Barrier film No. 1, the ratio of necessary time to obtain the final form of a barrier film was listed in Table 1.

Each evaluation result was listed in Table 1.

As is clear from Table 1, the property of the organic photoelectric conversion element prepared by using a barrier film of the present invention tends not to degrade, since the method of forming a barrier film of the present invention is highly efficient, and a barrier film obtained by the method of the present invention exhibits low moisture permeability and an excellent surface flatness.

Example 2

Preparation of Bather film Nos. 9-14

The same evaluation as described in Example 1 was carried out, except that the constitution of the organic layer and the inorganic layer in Barrier film No. 1 in Example 1 was changed as described below. The results were shown in Table 2.

Barrier film No. 9 in which inorganic layer/organic layer were laminated in this order on a polyester film substrate wad abbreviated as "9: inorganic layer/organic layer". Barrier film Nos. 10-14 were also similarly abbreviated.

10: organic layer/inorganic layer
11: organic layer/organic layer/inorganic layer
12: organic layer/inorganic layer/inorganic layer
13: organic layer/inorganic layer/organic layer/inorganic layer/organic layer/ inorganic layer/inorganic layer
14: organic layer/inorganic layer/organic layer/inorganic layer/organic layer/ inorganic layer r/organic layer/inorganic layer

TABLE 1

| Barrier film No. | Set value of atmospheric pressure Atmosphere | Atmospheric pressure adjusting process | Surface roughness Rt | Moisture permeation rate (5-step evaluation) | Conversion efficiency ratio of before and after enforced degradation test (5-step evaluation) | Ratio of accumulation time of organic and inorganic layers | Remarks |
|---|---|---|---|---|---|---|---|
| 1 | 1.0 | none | 10 | 5 | 5 | 1.00 | Inventive example |
| 2 | 1.2 | provided | 42 | 3 | 3 | 2.00 | Comparative example |
| 3 | 1.1 | provided | 17 | 5 | 4 | 1.30 | Inventive example |
| 4 | 0.8 | provided | 13 | 5 | 5 | 1.10 | Inventive example |
| 5 | 0.6 | provided | 16 | 5 | 5 | 1.30 | Inventive example |
| 6 | 0.4 | provided | 18 | 4 | 5 | 1.50 | Inventive example |
| 7 | 0.3 | provided | 20 | 4 | 4 | 1.60 | Inventive example |
| 8 | 0.2 | provided | 51 | 2 | 3 | 2.90 | Comparative example |

TABLE 2

| Barrier film No. | Set value of atmospheric pressure Atmosphere | Atmospheric pressure adjusting process | Surface roughness Rt | Moisture permeation rate (5-step evaluation) | Conversion efficiency ratio of before and after enforced degradation test (5-step evaluation) | Ratio of accumulation time of organic and inorganic layers | Remarks |
|---|---|---|---|---|---|---|---|
| 9 | 1.0 | none | 28 | 1 | 2 | 0.70 | Comparative example |
| 10 | 1.0 | none | 25 | 2 | 2 | 0.70 | Comparative example |
| 11 | 1.0 | none | 23 | 2 | 3 | 0.85 | Comparative example |
| 12 | 1.0 | none | 16 | 5 | 4 | 0.85 | Inventive example |
| 13 | 1.0 | none | 12 | 5 | 5 | 1.30 | Inventive example |
| 14 | 1.0 | none | 20 | 4 | 4 | 1.50 | Inventive example |

Example 3

The same evaluation as described in Example 1 was carried out, except that formation of the inorganic layer of Barrier film No. 1 was changed as described below.
Formation of Inorganic Layer Under the condition of reduced pressure at $1\times10^{-5}$ atmosphere, an inorganic layer (silicon oxide) having a thickness of 150 nm was formed using a sputtering apparatus while using silicon as a target, argon as a discharge gas, and oxygen as a reactive gas.

Barrier film No. 15: only the first inorganic layer was changed

Barrier film No. 16: only the first inorganic layer was changed

Barrier film No. 17: both of the first and the second inorganic layers were changed On the obtained Barrier film Nos. 15-17, the same evaluation as described in Example 1 was carried out. The results were shown in Table 3.

TABLE 3

| Barrier film No. | Atmospheric pressure adjusting process | Surface roughness Rt | Moisture permeation rate (5-step evaluation) | Conversion efficiency ratio of before and after enforced degradation test (5-step evaluation) | Ratio of accumulation time of organic and inorganic layers | Remarks |
|---|---|---|---|---|---|---|
| 15 | provided | 25 | 3 | 2 | 2.00 | Comparative example |
| 16 | provided | 26 | 2 | 3 | 2.00 | Comparative example |
| 17 | provided | 32 | 2 | 2 | 3.00 | Comparative example |

As the effect of the change to the film formation step under vacuum, the time necessary to form a film was extremely prolonged, whereby the energy conversion efficiency became low since the surface flatness was deteriorated.

Example 4

Barrier Film No. 18

The same evaluation as described in Example 1 was carried out, except that, in Barrier film No. 1 in Example 1, the organic layer coating liquid used for the organic layer was changed as will be described below, and the inorganic layer was changed into 2 layers.

A 20% by mass dibutyl ether solution of organicpolysilazane (AQUAMICA MHPS-20 DB, produced by AZ Electronic Materials, Ltd.) was applied using a wireless bar, followed by drying, so that the layer thickness after dried was 0.8 μm, to obtain an applied and dried sample.

(Bather Film No. 19)

The same evaluation as described in Example 1 was conducted except that, in the method of forming Barrier film No. 1, conversion treatment provided to the inorganic layer was changed to a UV/ozone treatment described below.

Table top photo surface processor MODL: PL16-110, produced by SEN LIGHTS Corporation Irradiation distance 10 mm Irradiation time 5 minutes (Barrier Film No. 20)

The same evaluation as described in Example 1 was conducted except that, in Bather film No. 1 prepared in Example 1, the inorganic layer coating liquid used for the inorganic layer was changed as described below.

The following 5% toluene solution of mocta(hydroxydimethylsiloxy) silsesquioxane was applied.

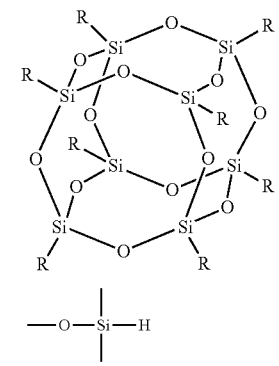

$R = \text{—O—Si—H}$

On each of obtained Barrier film Nos. 18-20, the same evaluation as described in Example 1 was carried out. The results were shown in Table 4.

TABLE 4

| Barrier film No. | Set value of atmospheric pressure Atmosphere | Atmospheric pressure adjusting process | Surface roughness Rt | Moisture permeation rate (5-step evaluation) | Conversion efficiency ratio of before and after enforced degradation test (5-step evaluation) | Ratio of accumulation time of organic and inorganic layers | Remarks |
|---|---|---|---|---|---|---|---|
| 18 | 1.0 | none | 27 | 2 | 1 | 0.70 | Comparative example |
| 19 | 1.0 | none | 9 | 4 | 4 | 1.10 | Inventive example |

TABLE 4-continued

| Barrier film No. | Set value of atmospheric pressure Atmosphere | Atmospheric pressure adjusting process | Surface roughness Rt | Moisture permeation rate (5-step evaluation) | Conversion efficiency ratio of before and after enforced degradation test (5-step evaluation) | Ratio of accumulation time of organic and inorganic layers | Remarks |
|---|---|---|---|---|---|---|---|
| 20 | 1.0 | none | 14 | 4 | 4 | 1.00 | Inventive example |

As is clear from Table 4, the property of the organic photoelectric conversion element prepared by using a barrier film of the present invention tends not to degrade.

Example 5

The same evaluation was conducted except that the formation of the inorganic layer formed in Example 3 was changed as follows.
A layer containing the following silicon compound was laminated via a CVD (chemical vapor deposition) method.
The layer thickness was 150 nm, and the substrate temperature was kept at 120° C. during the layer formation.

Using a roll electrode type discharge treatment apparatus, a plurality of rod-shaped electrodes each facing a roll electrode were installed parallel to the film conveyance direction, and a thin film was formed by supplying a raw material and electric power to each electrode portion as described below.

Both of the opposed electrodes were coated with a dielectric material of a thickness of 1 mm by thermal spraying. The distance between the electrodes after coated with the dielectric material was set to 1 mm. The metal base material which was coated with the dielectric material was of a jacket type made of stainless steel having a cooling function with cooling water. The discharge was carried out while controlling the electrode temperature with cooling water. A high frequency power source from OYO ELECTRIC Co., Ltd. (100 kHz) and a high frequency power source from Pearl Kogyo Co., Ltd. (13.56 MHz) were used as the power sources.

<Layer Containing Silicon Compound>
  Discharge gas: $N_2$ gas
  Reactive gas 1: 8% of oxygen based on whole the gas
  Reactive gas 2: 0.1% of 2,2,4,4,6,6-hexamethylcyclotrisilazane based on whole the gas
  Power of low frequency side power source: 2 W/cm² of 100 kHz wave
  Power of high frequency side power source: 10 W/cm² of 13.56 MHz wave The accumulation rate per 1 second was varied by controlling the supply amount of the reaction gas.

The maximum profile peak height Rt(p) after the plasma treatment was 12 nm.

Barrier film No. 21: accumulation rate of 1 nm/sec
Barrier film No. 22: accumulation rate of 15 nm/sec
On each of obtained Barrier film Nos. 21-22, the same evaluation as described in Example 1 was carried out. The results were shown in Table 5.

TABLE 5

| Barrier film No. | Atmospheric pressure adjusting process | Surface roughness Rt | Moisture permeation rate (5-step evaluation) | Conversion efficiency ratio of before and after enforced degradation test (5-step evaluation) | Ratio of accumulation time of organic and inorganic layers | Remarks |
|---|---|---|---|---|---|---|
| 21 | none | 27 | 3 | 3 | 2.00 | Comparative example |
| 22 | none | 41 | 1 | 2 | 1.30 | Comparative example |

When compared with the method of the present invention, compatibility of efficient preparation time and a high bather property could not be obtained.

Example 6

Preparation of Bather Film No. 23

Barrier film No. 23 was prepared in the same manner as described in Example 1, except that a xenon excimer irradiation equipment MODEL: MECL-M-1-200 (wavelength of 172 nm) with a work stage moving system, produced by M.D. Excimer Inc, was used to conduct a vacuum ultraviolet light treatment, instead of the plasma treatment in the manufacturing process of Bather film No. 1 in Example 1.

(Irradiation of Vacuum Ultraviolet Light)
The sample was fixed so that the irradiation distance between a vacuum ultraviolet light lamp and the aforementioned sample was 2 mm, and, while the temperature of the sample was kept at 90° C., the sample was conveyed back and forth at a moving speed of the stage of 10 mm/sec to irradiate. The sample was irradiated with the vacuum ultraviolet light 7 times back and forth, and then taken out.

(Adjustment of Oxygen Concentration)
The oxygen concentration at the time of vacuum ultraviolet light (VUV) irradiation was adjusted so that the oxygen concentration was 0.1% by volume-0.5% by volume, by measuring the flow rates of the nitrogen gas and the oxygen gas introduced into the irradiation vessel with a flow meter to control the flow ratio of nitrogen gas/oxygen gas.

Finally, a 4-layer constitution of organic layer/inorganic layer/organic layer/inorganic layer was obtained on a polyester film. The surface roughness after the vacuum ultraviolet light treatment of the inorganic layer which was the outermost surface was 7 nm.

<Preparation of Barrier Film Nos. 24-30>

Bather film Nos. 24-30 were prepared in the same manner as the preparation of Bather film No. 23, except that the atmospheric pressure in the steps from the organic layer and the bleedout prevention layer formation step to the step of vacuum ultraviolet treatment onto the surface of the silazane compound was changed as shown in Table 6.

On obtained Bather film Nos. 23-30, the same evaluation as conducted in Example 1 was carried out. The results will be shown in Table 6.

TABLE 6

| Barrier film No. | Set value of atmospheric pressure Atmosphere | Atmospheric pressure adjusting process | Surface roughness Rt | Moisture permeation rate (g/m² · day) (5-step evaluation) | Conversion efficiency ratio of before and after enforced degradation test (5-step evaluation) | Ratio of accumulation time of organic and inorganic layers | Remarks |
|---|---|---|---|---|---|---|---|
| 23 | 1.0 | none | 7 | 5 | 5 | 1.00 | Inventive example |
| 24 | 1.2 | provided | 39 | 3 | 3 | 1.90 | Comparative example |
| 25 | 1.1 | provided | 14 | 4 | 5 | 1.25 | Inventive example |
| 26 | 0.8 | provided | 9 | 5 | 5 | 1.05 | Inventive example |
| 27 | 0.6 | provided | 14 | 5 | 5 | 1.25 | Inventive example |
| 28 | 0.4 | provided | 17 | 5 | 4 | 1.45 | Inventive example |
| 29 | 0.3 | provided | 24 | 4 | 4 | 1.70 | Inventive example |
| 30 | 0.2 | provided | 80 | 2 | 3 | 2.60 | Comparative example |

As is clear from Table 6, the property of the organic photoelectric conversion element prepared by using a barrier film of the present invention tends not to degrade, since the method of forming a barrier film of the present invention is highly efficient and a barrier film obtained by the method of the present invention exhibits low moisture permeability and an excellent surface flatness.

Example 7

Preparation of Barrier Film Nos. 31-36

The same evaluation as described in Example 1 was carried out, except that the constitution of the organic layer and the inorganic layer in Bather film No. 23 in Example 6 was changed as described below. The results were shown in Table 7.

Barrier film No. 31 in which inorganic layer/organic layer were laminated in this order on a polyester film substrate wad abbreviated as "31: inorganic layer/organic layer". Barrier film Nos. 32-36 were also similarly abbreviated.

32: organic layer/inorganic layer

33: organic layer/organic layer/inorganic layer

34: organic layer/inorganic layer/inorganic layer

35: organic layer/inorganic layer/organic layer/inorganic layer/organic layer/inorganic layer/inorganic layer 36: organic layer/inorganic layer/organic layer/inorganic layer/organic layer/inorganic layer/organic layer/inorganic layer

TABLE 7

| Barrier film No. | Atmospheric pressure adjusting process | Surface roughness Rt | Moisture permeation rate (g/m² · day) (5-step evaluation) | Conversion efficiency ratio of before and after enforced degradation test (5-step evaluation) | Ratio of accumulation time of organic and inorganic layers | Remarks |
|---|---|---|---|---|---|---|
| 31 | none | 24 | 2 | 1 | 0.65 | Comparative example |
| 32 | none | 22 | 2 | 1 | 0.65 | Comparative example |
| 33 | none | 10 | 3 | 2 | 0.80 | Comparative example |
| 34 | none | 9 | 5 | 5 | 0.80 | Inventive example |
| 35 | none | 10 | 5 | 5 | 1.20 | Inventive example |
| 36 | none | 17 | 4 | 5 | 1.40 | Inventive example |

Example 8

Preparation of Barrier Film Nos. 37 and 38

The same evaluation as described in Example 1 was carried out, except that, in Barrier film No. 23 in Example 6, the vacuum ultraviolet light treatment was changed as follows. The results were shown in Table 8.

Barrier film No. 37: no vacuum ultraviolet light treatment of the first inorganic layer Barrier film No. 38: no vacuum ultraviolet light treatment of the second inorganic layer

TABLE 8

| Barrier film No. | Atmospheric pressure adjusting process | Surface roughness Rt | Moisture permeation rate (g/m² · day) (5-step evaluation) | Conversion efficiency ratio of before and after enforced degradation test (5-step evaluation) | Ratio of accumulation time of organic and inorganic layers | Remarks |
|---|---|---|---|---|---|---|
| 37 | none | 17 | 1 | 1 | 1.00 | Comparative example |
| 38 | none | 36 | 2 | 1 | 1.00 | Comparative example |

As is clear from Table 8, the property of the organic photoelectric conversion element prepared by using a barrier film of the present invention tends not to degrade.

What is claimed is:

1. A method of producing a barrier film comprising at least one organic layer and two or more inorganic layers on a surface of a plastic film comprising the steps of:
   forming an organic layer of photosensitive resin by applying a photosensitive resin composition comprising an acrylate compound in wet method on at least one surface of the plastic film, under a pressure of 0.3 atmosphere or more but 1.1 atmosphere or less (1 atmosphere being $1.01325 \times 10^5$ Pa);
   after the forming step, applying an inorganic layer coating liquid comprising a silazane compound on the organic layer, to laminate 2-6 inorganic layers, under a pressure of 0.3 atmosphere or more but 1.1 atmosphere or less; and
   carrying out a conversion treatment on at least two layers among the laminated inorganic layers.

2. The method of claim 1, wherein forming the organic layer and laminating the inorganic layers are carried out under a pressure of 0.8 atmosphere-1.1 atmosphere.

3. The method of claim 1, wherein the conversion treatment applied to the inorganic layers is a plasma treatment.

4. The method of claim 1, wherein the conversion treatment applied to the inorganic layers is irradiation of vacuum ultraviolet light.

5. The method of claim 1, wherein a sum of a number of the organic layer and a number of the inorganic layers is 3 or more but 7 or less.

6. A barrier film produced by the method of claim 1.

7. The method of claim 1, wherein the conversion treatment applied to the inorganic layers is irradiation of vacuum ultraviolet light.

8. The method of claim 1, wherein a bleedout preventing layer is provided on the surface of the plastic film opposite to the surface on which the organic layer is provided.

9. The method of claim 1, wherein a corona treatment is conducted on the plastic film before providing an organic film or an inorganic film.

10. The method of claim 1, wherein the barrier film has a layer constitution of:
    Organic layer/Inorganic layer/Inorganic layer, formed on the plastic layer.

11. The method of claim 1, wherein the barrier film has a layer constitution of:
    Organic layer/Inorganic layer/Inorganic layer/Inorganic layer, formed on the plastic layer.

12. The method of claim 1, wherein the barrier film has a layer constitution of:
    Organic layer/Inorganic layer//Organic layer/Inorganic layer, formed on the plastic layer.

13. An organic photoelectric conversion element sealed by employing the barrier film of claim 6.

* * * * *